United States Patent
Lo Hine Tong et al.

(10) Patent No.: US 9,960,486 B2
(45) Date of Patent: May 1, 2018

(54) CIRCUIT BOARD FOR AN ANTENNA ASSEMBLY

(71) Applicant: THOMSON LICENSING, Issy les Moulineaux (FR)

(72) Inventors: Dominique Lo Hine Tong, Rennes (FR); Philippe Minard, Saint Medard sur Ille (FR); Jean-Marc Le Foulgoc, Bourgbarre (FR)

(73) Assignee: THOMSON LICENSING, Issy les Moulineaux (FR)

( * ) Notice: Subject to any disclaimer, the term of this patent is extended or adjusted under 35 U.S.C. 154(b) by 9 days.

(21) Appl. No.: 15/334,605

(22) Filed: Oct. 26, 2016

(65) Prior Publication Data

US 2017/0125894 A1    May 4, 2017

(30) Foreign Application Priority Data

Oct. 29, 2015 (EP) .................................... 15306729

(51) Int. Cl.
| | | |
|---|---|---|
| *H01Q 1/38* | (2006.01) | |
| *H01Q 1/48* | (2006.01) | |
| *H01Q 13/10* | (2006.01) | |
| *H01Q 1/22* | (2006.01) | |

(52) U.S. Cl.
CPC ............ *H01Q 1/38* (2013.01); *H01Q 1/2258* (2013.01); *H01Q 1/48* (2013.01); *H01Q 13/106* (2013.01)

(58) Field of Classification Search
CPC .. H01Q 1/38; H01Q 1/22; H01Q 1/48; H01Q 13/106
USPC .................. 343/702, 700 MS, 846, 767–770
See application file for complete search history.

(56) References Cited

U.S. PATENT DOCUMENTS

| | | | |
|---|---|---|---|
| 6,034,575 A | 3/2000 | Watanabe | |
| 7,948,769 B2 | 5/2011 | Jakab et al. | |
| 8,878,602 B1 | 11/2014 | Hsu et al. | |
| 2003/0193437 A1 | 10/2003 | Kangasvieri et al. | |
| 2005/0107044 A1 | 5/2005 | Bae | |
| 2010/0220015 A1* | 9/2010 | Pintos ................... | H01Q 1/243 343/700 MS |
| 2013/0120201 A1* | 5/2013 | Park ....................... | H01Q 1/48 343/749 |
| 2013/0214977 A1 | 8/2013 | Cheng | |
| 2013/0249742 A1* | 9/2013 | Yukimoto ............... | H01Q 9/36 343/700 MS |
| 2014/0015723 A1* | 1/2014 | Cho ....................... | H01Q 13/103 343/750 |
| 2014/0043201 A1 | 2/2014 | Pelosi et al. | |

(Continued)

OTHER PUBLICATIONS

Lo Hine Tong et al., "Stamped Metal Antenna Including a Feeding Transmission Line", IEEE MTT-S International Microwave Symposium, Phoenix, Arizona, USA, May 17, 2015, pp. 1-4.

*Primary Examiner* — Dameon E Levi
*Assistant Examiner* — Hasan Islam
(74) *Attorney, Agent, or Firm* — Brian J. Dorini; Patricia A. Verlangieri

(57) ABSTRACT

A circuit board for an antenna assembly comprising: an antenna, a slot extending from a front end of the circuit board for trapping ground currents generated by the antenna, at least one electronic component placed at a front end of the circuit board, at least one of a biasing line and a ground line for the at least one electronic component wherein the biasing line and/or the ground line are routed from the electronic component through the slot.

7 Claims, 3 Drawing Sheets

(56) References Cited

U.S. PATENT DOCUMENTS

2014/0112511 A1    4/2014  Corbn et al.
2015/0123861 A1*   5/2015  Lo Hine Tong ......... H01Q 1/38
                                                    343/767

\* cited by examiner

CIRCUIT BOARD FOR AN ANTENNA ASSEMBLY

REFERENCE TO RELATED EUROPEAN APPLICATION

This application claims priority from European Application No. 15306729.3, entitled "Circuit Board for An Antenna Assembly," filed on Oct. 29, 2015, the contents of which are hereby incorporated by reference in its entirety.

TECHNICAL FIELD

The present invention relates to a circuit board for an antenna assembly.

BACKGROUND

Electronic wireless devices including mobile telephones, tablets, set-top boxes and gateway devices contain an increasing number of electronic components in an increasingly reduced space. They include, in particular, a high number of wireless features that require the integration of many antennas. The resulting density of circuits and components in a confined space is a real problem for the positioning and integration of the antennas on the main circuit board of such wireless devices because of the various constraints to cope with: lack of space, radio interferences to avoid, isolation between antennas to achieve etc.

FIG. 1 shows an example of a configuration of electronic components in a set-top box 11 including an antenna for transmission and reception of radio frequency waves. The optimum place for positioning an antenna is at the front of the wireless device. i.e. facing toward the user. However, the front area of the printed circuit board is already occupied by various components such as:
- a first group a LEDS (LED#1), for indicating the status of some features of the device, activity and connectivity: Power, Wi-Fi, recording etc.
- a second group of LEDs (LED#2) for illuminating the front panel logo.
- a high bit rate USB3 connector
- an infra-red (IR) sensor for remote control
- other electro-mechanical control components such as push-buttons (PB).

When these components are placed on the front edge of the PCB, the remaining space for positioning of antennas is limited.

In area A1, there is available space where would be possible to print an antenna; A second area A2 is also available, however because of the proximity of the USB3 connector, which can behave as a noisy interface, creating for instance electromagnetic interferences in the Wi-Fi 2.4 GHz band, this area therefore should be avoided. Area A3 is available for placing a second antenna. The problem here is the presence of the LEDs that are placed partially in front of the antenna. While the LEDs itself are not the real problem, since these components are quite "transparent" to radiowaves and barely impair the antenna behavior, the biasing lines for these components can degrade the sensitivity of antenna performance.

The present invention has been devised with the foregoing in mind.

SUMMARY

A first aspect of the invention provides a circuit board for an antenna assembly comprising: an antenna, a slot extending from a front end of the circuit board for trapping ground currents generated by the antenna, at least one electronic component placed at a front end of the circuit board, at least one of a biasing line and a ground line for the at least one electronic component wherein the biasing line and/or the ground line are routed from the electronic component through the slot.

In an embodiment, the slot has a length corresponding to the quarter wavelength of operating frequency band of the antenna.

In an embodiment, the slot is terminated at one end by a short circuit and the ground line is connected to the said end.

In an embodiment, a filtering circuit is provided at the short circuit end of the slot.

In an embodiment, the at least one electronic component comprises at least one of a display, an LED, an infra-red sensor, a control unit, and a USB connector A second aspect of the invention provides an electronic communication device comprising a circuit board according to any embodiment of the first aspect of the invention.

In an embodiment, the electronic communication device is a gateway device or a set top box.

BRIEF DESCRIPTION OF THE DRAWINGS

Embodiments of the invention will now be described, by way of example only, and with reference to the following drawings in which.

DETAILED DESCRIPTION

Figure 1:
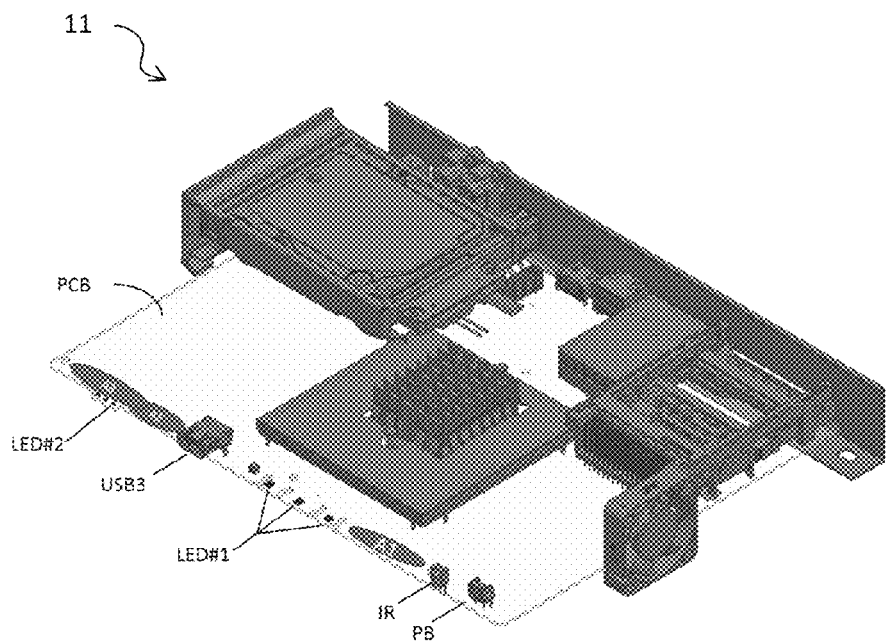
FIG. 1 is a perspective view of an example of a wireless electronic device.
Figure 2:
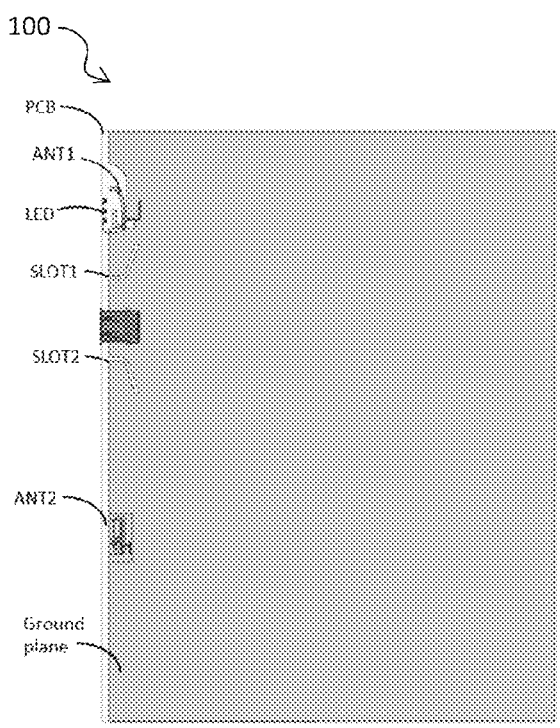
FIG. 2 is a schematic diagram of a PCB on which two antennas are mounted.

FIG. 2 is a schematic diagram of a PCB 100 for a wireless electronic device such as a set top box on which a ground plane and two antennas ANT1; ANT2 are printed. ANT 1 is a 2.4/5 GHz Wi-Fi antenna; ANT2 is a 2.4 GHz band antenna which can be used for Wi-Fi, ZigBee, Bluetooth or RF4CE applications for example. It will be appreciated that in the context of the invention other types of antenna and antenna for other frequencies may be used.

Two slots SLOT1 and SLOT2 are provided on the PCB 100 for mitigating potential interferences generated for example by a USB connector, and to provide the required isolation between the antennas ANT1 and ANT2.

A set of LEDs LED is provided for illuminating a logo on the front panel of the set top box and is positioned in front of antenna ANT1.

Figure 3:
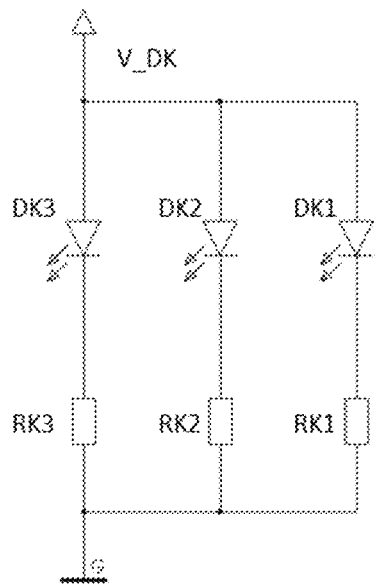
FIG. 3 is a circuit diagram giving an example of a LED biasing circuit.

FIG. 3 is a circuit diagram illustrating how the LEDs are biased: each LED, DK1-3 is terminated by a resistor RK1-3 (typically 100-ohm); The LEDs are set in parallel configuration and biased by a common voltage (V_DK=3.3V).

Figure 4:
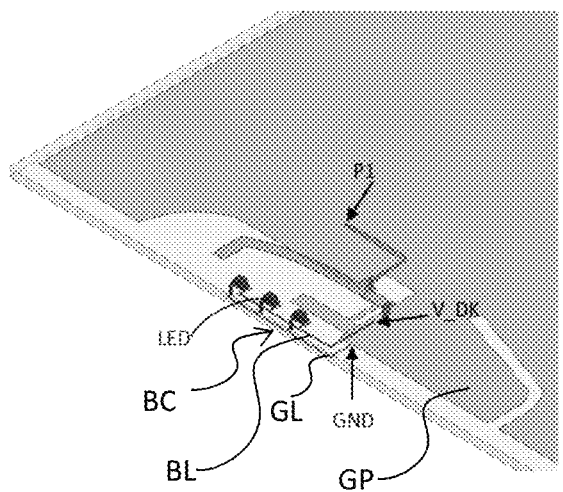
FIG. 4 is a perspective view of a PCB, on which an LED biasing circuit is mounted.

FIG. 4 gives a close-up view of a conventional LEDs biasing circuit BC, a grounding line GL is routed in the bottom layer of the PCB and is directly connected to the main ground plane GP, while a biasing line BL is routed on the top layer to be connected to the board V_DK trace of the system.

Such a configuration a biasing circuit leads to performance degradation of the antenna for the following reasons.
1. high ground currents flow on the edge of the PCB ground plane, more particularly on the side where the antenna is placed. Therefore, when connecting the LEDs grounding line nearby the antenna ground plane, its behavior is strongly disturbed, lowering the radiation efficiency, degrading the impedance matching etc.
2. Regarding the biasing line, routed on the top layer, because it crosses the PCB ground plane and because the source impedance is very low at the input port. It has also an influence on the currents flowing along the ground plane edge and thus on antenna performance.

Figure 5:
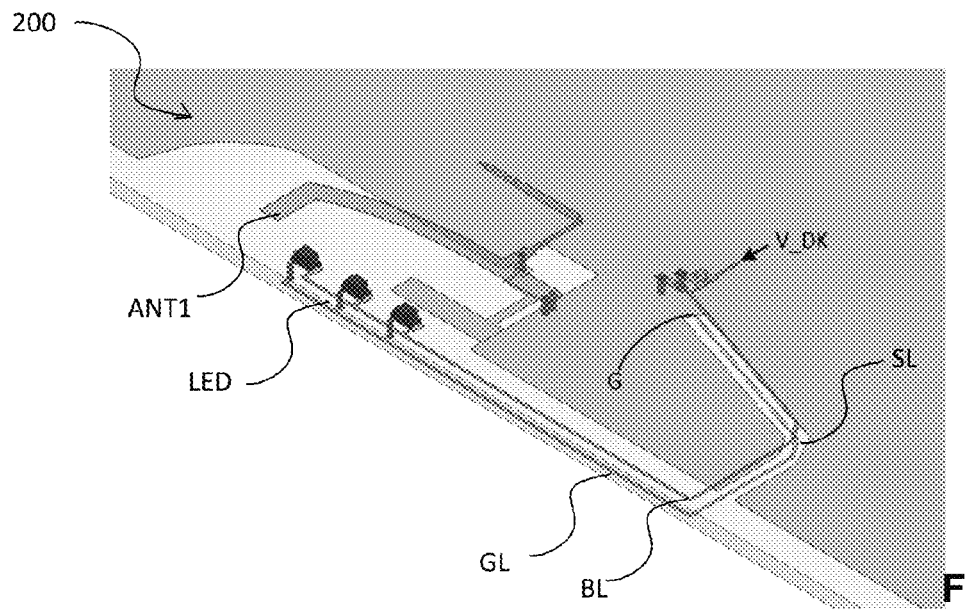
FIG. 5 is a perspective view of a PCB, in accordance with an embodiment of the invention.
Figure 6:
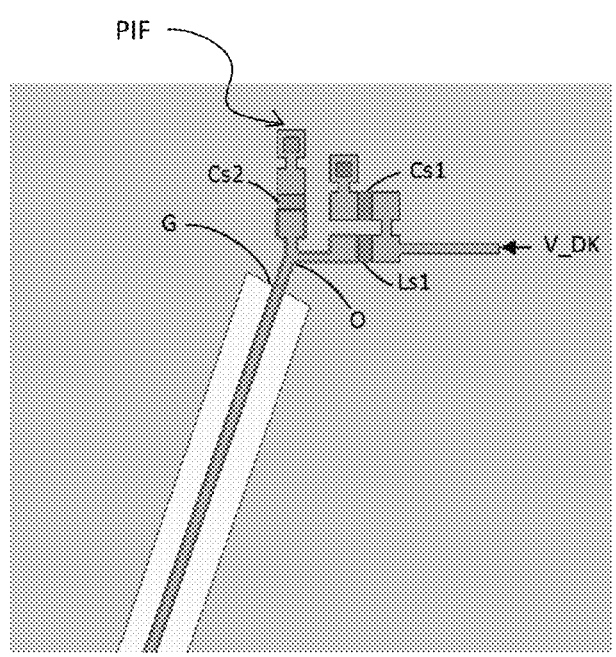
FIG. 6 is a perspective view of a filtering circuit, in accordance with an embodiment of the invention.

FIGS. 5 and 6 schematically illustrate a printed circuit board 200 in accordance with an embodiment of the invention. As in the previous example an antenna ANT1 is located behind a set of LEDs LED.

A biasing line (BL) and a grounding (GL) line for the LEDS are routed through the slot placed nearby the antenna ANT1, following the slot path.

The slot SL extends from an outer end at the edge of the PCB 100 to an inner end has a length of quarter-wavelength at operating frequency band of the antenna ANT1 and is terminated by a short-circuit. The role of the slot SL is to trap the ground currents created by the antenna ANT1 at the PCB edge, limiting their flow in the opposite side of the slot, reducing consequently couplings with other elements (for example with the USB3 connector and antenna ANT2).

The LEDs grounding line GL is connected to the inner slot end, at the short-circuit point G, a point where ground current is very weak, with therefore a very low effect on the antenna behavior.

Regarding the biasing line BL, as previously pointed out its length on the ground plane and its input impedance have a sensitive effect on the antenna behavior. According to this embodiment of the invention, it is proposed to place a PI filtering circuit (PIF) at the slot short-circuit point G (FIG. 6) at the inner end of the slot. The goal here is to create a very high impedance at the slot short-circuit plan, G or O, a kind of open-circuit in the antenna frequency band.

To demonstrate the concept, a simulation was performed with the following setting.
Slot width and length: 1.3 mm and 21 mm
Ls1=27 nH, Cs1=100 pF, Cs2=not used
Input load at V_DK: 0.5 ohm.
Grounding and biasing lines with: 0.2 mm.

The antenna radiation efficiency improves, reaching a level similar to the one when there is no component on the antenna front side.

Although the present invention has been described hereinabove with reference to specific embodiments, the present invention is not limited to the specific embodiments, and modifications will be apparent to a skilled person in the art which lies within the scope of the present invention.

For instance, while the foregoing examples have been described with respect to a set top box it will be appreciated that the invention may be applied to any other wireless electronic communication device employing an antenna.

Many further modifications and variations will suggest themselves to those versed in the art upon making reference to the foregoing illustrative embodiments, which are given by way of example only and which are not intended to limit the scope of the invention, that being determined solely by the appended claims. In particular the different features from different embodiments may be interchanged, where appropriate.

The invention claimed is:

1. A circuit board for an antenna assembly comprising:
an antenna,
a slot extending along a path from a front end of the circuit board, for trapping ground currents generated by the antenna,
at least one electronic component placed at a front end of the circuit board; and
a biasing line and a ground line for the at least one electronic component, wherein the biasing line and the ground line are routed from the electronic component from the front end of the circuit board through the slot, along the path of the slot.

2. The circuit board according to claim 1, wherein the slot has a length corresponding to the quarter wavelength of operating frequency band of the antenna.

3. The circuit board according to claim 1, wherein the slot is terminated at one end by a short circuit and, and the ground line is connected to the said end.

4. The circuit board according to claim 3, wherein a filtering circuit is provided at the short circuit end of the slot.

5. The circuit board according to claim 1, wherein the at least one electronic component comprises at least one of a display, an LED, an infra-red sensor, a control unit, and a USB connector.

6. An electronic communication device comprising the circuit board according to claim 1.

7. The electronic communication device according to claim 6 wherein the electronic communication device is a gateway device or a set top box.

* * * * *